(12) United States Patent
Staender et al.

(10) Patent No.: US 12,061,111 B2
(45) Date of Patent: Aug. 13, 2024

(54) GRAVIMETRIC MEASURING SYSTEM

(71) Applicant: SARTORIUS LAB INSTRUMENTS GMBH & CO. KG, Goettingen (DE)

(72) Inventors: Malte Staender, Heilbad Heiligenstadt (DE); Jan Von Steuben, Goettingen (DE); Michael Laubstein, Goettingen (DE); Heyko Holst, Goettingen (DE)

(73) Assignee: SARTORIUS LAB INSTRUMENTS GMBH & CO., KG, Goettingen (DE)

(*) Notice: Subject to any disclaimer, the term of this patent is extended or adjusted under 35 U.S.C. 154(b) by 402 days.

(21) Appl. No.: 17/393,851

(22) Filed: Aug. 4, 2021

(65) Prior Publication Data

US 2021/0364341 A1 Nov. 25, 2021

Related U.S. Application Data

(63) Continuation of application No. PCT/EP2020/052676, filed on Feb. 4, 2020.

(30) Foreign Application Priority Data

Feb. 5, 2019 (DE) ...................... 10 2019 102 801.9

(51) Int. Cl.
*G01G 21/28* (2006.01)
*G01G 23/48* (2006.01)
(Continued)

(52) U.S. Cl.
CPC .......... *G01G 21/286* (2013.01); *G01G 23/48* (2013.01); *H05K 5/03* (2013.01); *H05K 7/1424* (2013.01); *H05K 7/18* (2013.01)

(58) Field of Classification Search
CPC ...... H05K 5/03; H05K 7/1424; H05K 7/1425; H05K 7/18; G01G 21/28; G01G 21/286; G01G 23/48
See application file for complete search history.

(56) References Cited

U.S. PATENT DOCUMENTS 6,134,615 A * 10/2000 Chari ................... H05K 7/1498
  715/835
6,909,058 B2  6/2005 Luchinger et al.
(Continued)

FOREIGN PATENT DOCUMENTS

CN  1346969 A  5/2002
CN  1656362 A  8/2005
(Continued)

OTHER PUBLICATIONS

Chinese Office Action with English translation, CN Application No. 202080009178.6, Nov. 7, 2022, 29 pages.
(Continued)

*Primary Examiner* — Randy W Gibson
(74) *Attorney, Agent, or Firm* — Edell, Shapiro & Finnan, LLC

(57) ABSTRACT

A gravimetric measuring system (10) includes a balance (12) with a weighing chamber (22), surrounded by a plurality of weighing chamber walls (23, 24, 26, 28); an electromechanical weighing system (181); and an electronic control apparatus (36) controlling the system operation according to routines stored in a memory (363) thereof; and a plurality of functional modules (14, 16), configured to be inserted into module receptacles, arranged on at least one weighing chamber wall (28). The at least one weighing chamber wall (28) is designed as a carrier structure, with recesses (283) which constitute clearances occupying a majority of the wall surface and which form the module receptacles. Either the functional modules (14, 16) or diaphragms (15) without a weighing function close the recesses and are spatially adapted to the recesses.

5 Claims, 3 Drawing Sheets

(51) Int. Cl.
*H05K 5/03* (2006.01)
*H05K 7/14* (2006.01)
*H05K 7/18* (2006.01)

(56) References Cited

U.S. PATENT DOCUMENTS

| | | | |
|---|---|---|---|
| 6,951,989 B2 * | 10/2005 | Nufer | G01G 23/00 |
| | | | 177/180 |
| 10,197,435 B2 | 2/2019 | Graf et al. | |
| 2002/0040814 A1 | 4/2002 | Luchinger et al. | |
| 2002/0040815 A1 | 4/2002 | Luchinger | |
| 2004/0079558 A1 | 4/2004 | Luchinger et al. | |
| 2004/0104055 A1 | 6/2004 | Nufer et al. | |
| 2005/0067197 A1 | 3/2005 | Rotach et al. | |
| 2010/0276213 A1 | 11/2010 | Zeiss et al. | |
| 2016/0252388 A1 | 9/2016 | Esser et al. | |
| 2016/0252389 A1 * | 9/2016 | Esser | H01L 21/67 |
| | | | 177/25.13 |
| 2021/0385960 A1 * | 12/2021 | Horii | H05K 5/03 |

FOREIGN PATENT DOCUMENTS

| | | |
|---|---|---|
| CN | 1776378 A | 5/2006 |
| CN | 105705918 A | 6/2016 |
| CN | 106298705 A | 1/2017 |
| DE | 102014101561 A1 | 5/2015 |
| EP | 1195584 A1 | 4/2002 |
| EP | 1312902 A1 | 5/2003 |
| EP | 1367372 A1 | 12/2003 |
| EP | 1396711 B1 | 1/2006 |
| EP | 3557199 A1 | 10/2019 |
| TW | 201343061 A | 10/2013 |
| WO | WO-2013111340 A1 * | 8/2013 ........... H05K 7/1425 |

OTHER PUBLICATIONS

International Search Report, PCT/EP2020/052676, May 19, 2020, 4 pages.

* cited by examiner

GRAVIMETRIC MEASURING SYSTEM

CROSS REFERENCE TO RELATED APPLICATIONS

This is a Continuation of International Application PCT/EP2020/052676, which has an international filing date of Feb. 4, 2020, and which claims the priority of German Patent Application 10 2019 102 801.9, filed Feb. 5, 2019. The disclosures of both applications are incorporated in their respective entireties into the present Continuation by reference.

FIELD OF THE INVENTION

The invention relates to a gravimetric measuring system, comprising
a balance with a weighing chamber, surrounded by a weighing chamber wall, an electromechanical weighing system and an electronic control apparatus for controlling the system operation according to routines stored in the memory thereof as well as
a plurality of functional modules, which can be inserted, if necessary, into module receptacles, arranged on the weighing chamber wall.

BACKGROUND

Gravimetric measuring systems of this type are known from EP 1 195 584 A1.

Analytical and laboratory balances, in particular, those that work on the principle of electromagnetic compensation, are well known. In this case an electromechanical weighing system, i.e., a typically complex lever mechanism with an input-side load receptacle and an output-side plunger coil arrangement, is arranged in a weighing system chamber, which is intended to ensure a shielding that is as good as possible with respect to environmental influences. A carrier, connected to the load receptacle, projects into a normally adjacent weighing chamber, which is also largely shielded from the environment, in particular, by its weighing chamber wall. The weighing chamber wall usually consists of the weighing chamber base, the weighing chamber cover, weighing chamber side walls as well as a front and rear wall. The rear wall may often coincide with a wall of the weighing system chamber. One side wall or both side walls of the weighing chamber are often designed as movable draft shield elements. The cover and/or the front side may also contain, as a rule, closable access openings. The coupling of the carrier to the load receptacle of the weighing system usually passes through the rear wall or the base of the weighing chamber.

Furthermore, such balances always contain a control apparatus, which controls, in particular, the weighing sensor system and, in so doing, specifically controls the plunger coil arrangement of the weighing system. However, the control apparatuses of modern balances can be designed to be significantly more complex and, in particular, can provide different operating routines of the system operation. Such operating routines may relate to controlling the sensor system or a cooling apparatus, but may relate, as an alternative or in addition, to controlling certain auxiliary apparatuses in or on the weighing chamber. Purely by way of example, mention may be made here of a cooling apparatus, a draft shield controller, lifting apparatuses inside the weighing chamber, lighting apparatuses and the like.

It is known from the representative document, mentioned in the introduction, to make such auxiliary apparatuses incorporating a weighing function available in the form of modules, i.e., as modules relating to the weighing function—in short: functional modules—and to provide a rail-like holding apparatus in the weighing chamber, in particular, on the rear wall thereof. Such holding apparatus have various mechanical interfaces, to which functional modules, required in the specific individual case, can be attached in the respectively required position. In other words, such functional modules can be inserted, as required, into corresponding module receptacles on the weighing chamber wall. Such a modular system is particularly advantageous in laboratory environments, in which different weighing tasks have to be carried out using one and the same balance. The balance can then be assembled by the user himself in accordance with his specific requirement in his particular case. Even in cases, where the mechanical interfaces are designed in such a way that the user cannot swap modules, such modular systems are also advantageous for the manufacturer. Using the same balance base body as a starting point, it is possible to pre-assemble balances for different weighing tasks by selecting the functional modules inserted into the module receptacles. The number of special parts to be produced is drastically reduced, an aspect that leads to a significant cost cutting.

This concept presents relatively few problems, if exclusively passive functional modules are used. Passive functional elements, which may be characterized as such herein, are those that require only a mechanical coupling for their fixation. Purely by way of example, reference may be made here to carriers, holders, shieldings, etc. In contrast, active functional modules, which contain their own electrical or electronic components, can also be fixed in the weighing chamber with the available mechanical interface in the known gravimetric measuring system. However, these active functional modules require additional connections that have to be designed individually. This aspect is a drawback with regard to the above explained flexibilization during the assembly of gravimetric measuring systems.

The post-published European patent document EP 3 557 199 A1 discloses a balance with a weighing chamber rear wall, which can be assembled from a plurality of wall elements. The height of this rear wall can be adapted to different draft shield heights; thus, weighing chambers of different heights can be constructed.

The European patent document EP 1 312 902 A1 discloses a balance, on the weighing chamber rear wall of which an electronic auxiliary unit, in which supply units, for example, a battery, or even an electronic control unit, can be arranged; consequently a functional module, as defined herein, can be attached.

The U.S. patent document US 2010/0276213 A1 also discloses a balance, on the weighing chamber rear wall of which an electronic control system is arranged. This electronic control system is mechanically and electronically connected to a dosing nozzle arranged above the load receiver, so that the balance can be used in its entirety as a dosing apparatus.

The European patent document EP 1 396 711 B1 discloses a balance with a weighing chamber, which is equipped without any functional modules. This balance dissipates the heat of the weighing electronics and out of the weighing chamber through a thermoelectric element, where in this case the special thermal coupling to the weighing chamber rear wall ensures the formation of a temperature gradient inside the weighing chamber.

The German patent document DE 10 2014 101 561 A1 discloses a gravimetric dosing apparatus with a climate measuring module arranged in the weighing chamber. Based on the climate data determined with the climate measuring module, the components, which are to be mixed in accordance with the dosing process, can be temperature-controlled beforehand outside the apparatus.

SUMMARY

An object of the present invention is to further develop a gravimetric measuring system of the generic type in such a way that a customized assembly according to specific requirements is facilitated.

This object is achieved by gravimetric measuring systems distinguishing over known systems in that they include diaphragms without a weighing function and in that at least one weighing chamber wall is configured as a carrier structure. This carrier structure is constructed, for example, of posts and struts, and has recesses, which constitute clearances occupying the major portion of the wall surface and which form the module receptacles. These recesses can be closed optionally with these diaphragms, which have no weighing function and which are spatially adapted to these recesses, or with these functional modules.

Preferred embodiments are the subject matter of the dependent claims.

The invention provides at least one weighing chamber wall, preferably a plurality of weighing chamber walls, to be constructed as a ribbed or lattice structure, which offers a plurality of identically formed recesses for the insertion of a variety of functional modules. Due to the identical design of the module receptacles it is possible to install correspondingly identically formed but mutually functionally different modules at virtually any point of the weighing chamber wall, in particular, where they are needed according to the current requirements. The design of the module receptacles as recesses also makes it possible to position additional connections, which will also be described further below, outside the weighing chamber, so that only the components, which are absolutely necessary in the weighing chamber, are located in the weighing chamber itself. This aspect is very important in terms of safety, cleanliness, temperature management, etc.

Since it is an object of the invention to offer a particular flexibility during the assembly of a balance, preference is given to providing more module receptacles than are needed to accommodate the functional modules that must be installed in typical applications. In order to ensure, nevertheless, the desired "tidiness" of the weighing chamber, the invention provides that the gravimetric measuring system also has, in addition to the balance and the functional modules, diaphragms, which serve no weighing function but by which those module receptacles in which no functional module is installed, can be closed. In this way different balances can be assembled for different applications. However, despite the mutually different applications, all of the balances have a weighing chamber even though they each feature only those apparatus options specifically and actually required, i.e., the various balances are each reduced to the minimum required for the desired function.

As already indicated above, the module receptacles according to the present invention provide preferably not only a purely mechanical fixing interface, but rather additional interfaces are made available preferably, in particular, with regard to active functional modules. Thus, in a further development of the invention it is provided that the carrier structure has in the region of at least one of its recesses a device-side identification interface component, which is contacted in an identification data-transmitting manner by a corresponding, module-side identification interface component, when a functional module is inserted. In so doing, the device-side identification interface components can be designed as optical, magnetic, tactile, radio or electronic receiving units; and the module-side identification interface components can be designed as corresponding optical, magnetic, tactile, radio or electronic transmitting units. The background of these measures is to create a way to automatically detect and identify the respectively installed functional modules. In particular, the module constellation can be automatically detected by the control unit of the balance. This information can then be used to adapt the functional control of the balance to the particular balance in question.

In particular, different routines of the balance operating system can become activated as a functional result of the particular module constellation detected. Such routines can relate to the control of the functional modules themselves. On the other hand, aspects that relate to the whole apparatus may also be affected. Thus, in an alternatively or additionally realizable embodiment of the invention, it is provided that the carrier structure has, in the region of at least one of its recesses, a device-side thermal interface component. This device-side thermal interface component is thermally connected to a central cooling apparatus and is thermally contacted by a corresponding, module-side thermal interface component, when a (particularly, active) functional module is inserted. Thermal interfaces of this type allow for the targeted dissipation of heat, which is generated in active functional modules by the electrical and electronic components thereof. Purely by way of example, mention may be made here of motor driven units, lighting units, ionizers, etc. In particular, in combination with the aforementioned identification interfaces, the control apparatus can activate special operating routines of the cooling apparatus as a function of the detected module constellation, so that, despite the differences in terms of magnitude and distribution of the heat output in different module constellations, an exact cooling compensation is achieved nevertheless. As a result, it is possible to achieve an optimized temperature distribution that is invariably the same in the weighing chamber.

For electrical and electronic, in particular, data-related contacting of the active functional modules, the module receptacles should also have corresponding interface components, which are then contacted, preferably automatically, by corresponding module-side interface components, when the functional modules are installed.

Usually, the particular weighing chamber wall at which there is the greatest demand for the installation of functional modules is the partition wall to the weighing system chamber, i.e., that chamber, in which the mechatronic weighing system, for example, a DMS (strain gauge) or EMC (electromagnetic force compensation) system, is located. In order for the corresponding balance to comply with the regulatory calibration requirements, this weighing system chamber must be completely sealed; in other words, it must be inaccessible to the user of the balance. This aspect is in apparent conflict of objectives with the above discussed accessibility of all interfaces. Therefore, in order to bridge this conflict of objectives, a further development of the invention provides for an embodiment in which the weighing chamber wall, designed as such a carrier structure, is positioned as a separating element between the weighing chamber and a weighing system chamber. This encloses the weighing system, connected to a sample carrier, arranged in the weighing chamber, wherein the recesses of the carrier structure are closed on the weighing system chamber side with a fixedly installed end wall. In other words, the weighing chamber wall in question is designed as a double layer. Towards the weighing chamber, the recesses of the present invention are open and have the device-side interface components that are accessible from the weighing chamber. In contrast, on the weighing system chamber side, all of the recesses are closed by a non-detachable wall, so that passage from the weighing chamber to the weighing system chamber is not possible. Consequently the weighing system chamber remains sealed so that the calibratability of the balance is not adversely affected. At the same time, however, the advantages of the invention explained above with regard to the flexibility during assembly can be fully utilized.

Other features and advantages of the invention will become apparent from the following specific description and the drawings.

DETAILED DESCRIPTION

Figure 1:
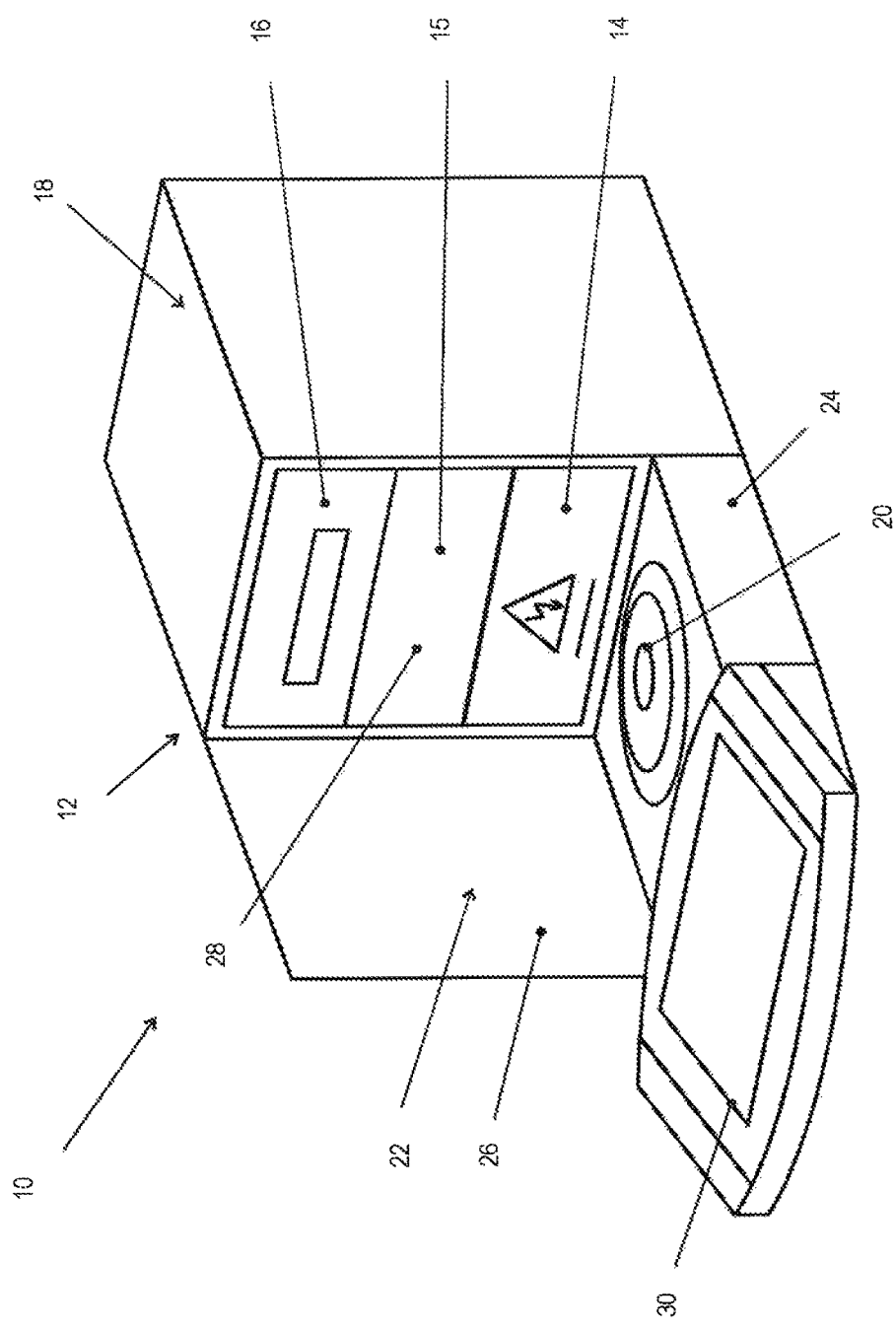
FIG. 1: a schematic representation of an inventive gravimetric measuring system in the final state of assembly with an incompletely illustrated weighing chamber wall.

Identical reference numerals and symbols in the figures indicate the same or analogous elements.

FIG. 1 shows a schematic representation of an inventive gravimetric measuring system 10, which consists essentially of a balance 12 and two functional modules 14, 16, inserted therein, as well as a diaphragm 15. In the embodiment shown, the functional module provided with the reference numeral 14 is a laser scanner unit, which is suitable for detecting bar codes; and the functional module provided with the reference numeral 16 is a lighting unit. However, the specific functions of the functional modules 14, 16 play no role in the context of the present invention.

Figure 3:
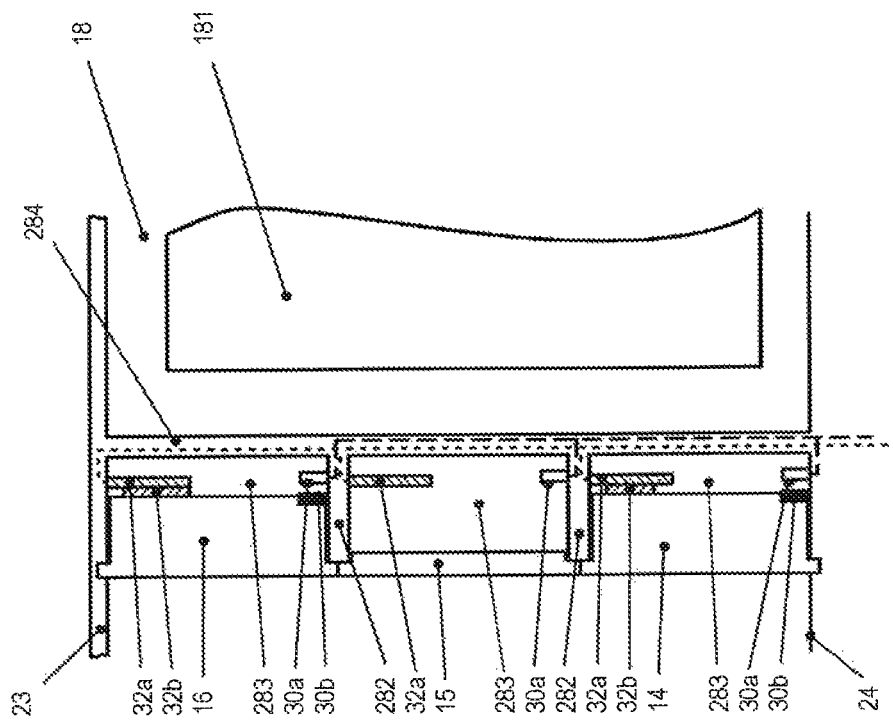
FIG. 3: an incomplete sectional view of the weighing chamber rear wall of the balance of the gravimetric measuring system from FIG. 1 and adjacent areas as well as FIG. 4: a schematic representation of a preferred cooling control of the balance of the gravimetric measuring system from FIG. 1.

In the embodiment shown, the balance 12 comprises essentially three regions, namely a weighing system chamber 18, in which a weighing system 181, indicated in FIG. 3, is arranged. The specific construction of the weighing system 181 does not play a role in the context of the present invention. In any case the weighing system 181 comprises a load receptacle (not shown separately), which is connected to a sample carrier 20, which in turn is arranged in a weighing chamber 22, adjoining the weighing system chamber 18 in the embodiment shown. The weighing chamber 22 is surrounded by a weighing chamber wall, which is shown only incompletely in FIG. 1. In particular, the weighing chamber base 24, through which the sample carrier 20 passes, a weighing chamber side wall 26 and a weighing chamber rear wall 28, all of which will be described in greater detail below, are illustrated. In the drawing shown in FIG. 1, the weighing chamber rear wall 28 is covered substantially by the front sides of the functional modules 14, 16 and the diaphragm 15, which is arranged between these functional modules 14, 16. Typically the weighing chamber wall also comprises an additional weighing chamber side wall, a weighing chamber front wall and a weighing chamber cover 23 (indicated only in FIGS. 2 and 3), but none of these are shown in FIG. 1 for reasons of clarity.

Furthermore, the balance 12 comprises an electronic unit 30, which in the case of the embodiment shown comprises essentially a large format display. The electronic unit 30 can additionally contain a control apparatus, which will be explained in more detail below. However, this control apparatus can also be arranged at another location of the balance 12. It is considered to be advantageous if this control unit is arranged so as to be thermally insulated from the weighing system chamber 18 and from the weighing chamber 22.

Figure 2:
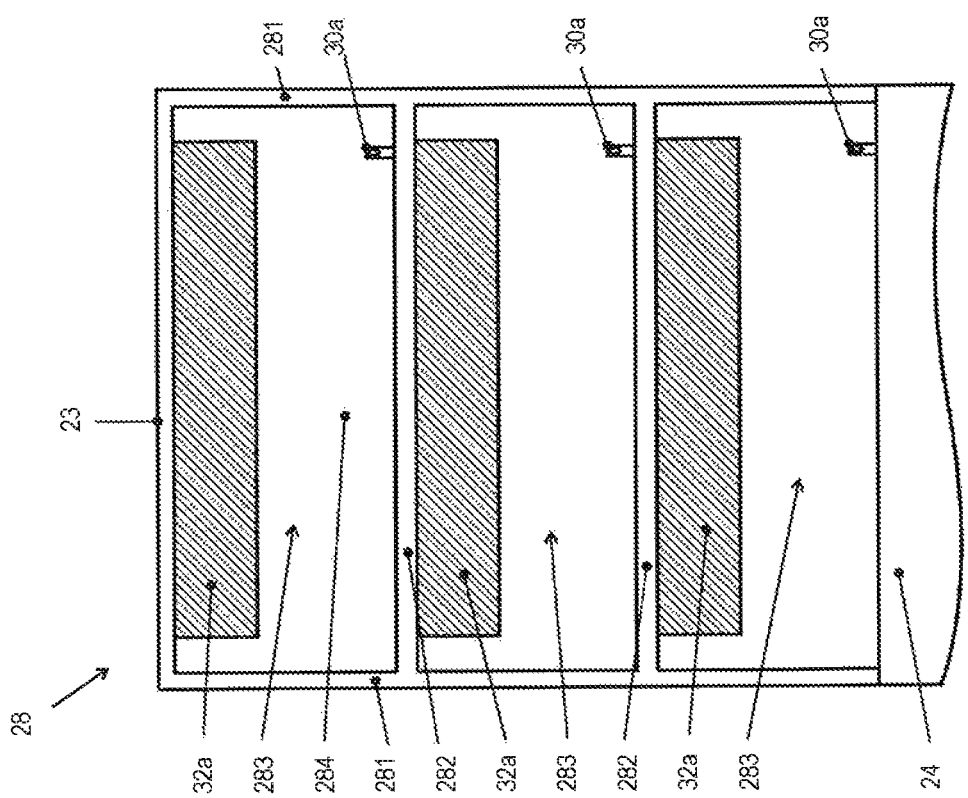
FIG. 2: the weighing chamber rear wall of the balance of the gravimetric measuring system from FIG. 1 in an intermediate state of assembly without inserted functional modules or diaphragms.

FIG. 2 shows a frontal view of the weighing chamber rear wall 28, but without the inserted functional modules 14, 16 and without the diaphragm 15. FIG. 3 shows a sectional view of the weighing chamber rear wall 28 and adjoining regions of the balance 12. However, the drawing from FIG. 3 also shows the inserted functional modules 14, 16 and the inserted diaphragm 15. Despite this difference an integrated view of FIGS. 2 and 3 makes it easier to understand the following description.

The weighing chamber rear wall 28 is constructed of vertical posts 281 and struts 282, arranged transversely thereto. Between these, there extend recesses 283, which are also referred to herein as module receptacles 283. On the weighing system chamber side, the weighing chamber rear wall 28 has an end wall 284, which seals the weighing system chamber 18 and which prevents passage through the module receptacles 283 into the weighing system chamber 18. In the illustrated embodiment the end wall 284 is at the same time the front wall of the weighing system chamber 18.

The module receptacles 283 serve to house in a spatially adapted manner the functional modules 14, 16. The embodiment according to FIGS. 1 and 3 has no functional module inserted into the central module receptacle 283 depicted in FIGS. 2 and 3. Instead, this recess 283 between the posts 281 and struts 282 is closed off with the diaphragm 15 towards the weighing chamber. The module receptacles 283 are designed identically with respect to their configuration, as will be described in greater detail below, so that the functional modules 14, 16 can be inserted, like other, compatibly designed functional modules, into each of the module receptacles 283. With regard to their size, the module receptacles 283 are designed preferably identically, in particular so that they merge into each other, and preferably without a separating element. This permits the functional modules 14, 16, the size of which corresponds to an integral multiple of a unit size, to be inserted so as to fit exactly into one or more adjacent module receptacles 283.

It is also feasible that the sizes of the module receptacles 283 themselves are different integer multiples of a unit size. The same comments made with respect to the functional modules 14, 16 also apply to the diaphragms 15.

Each module receptacle 283 has a device-side identification interface component 30*a*, which can interact with a corresponding module-side identification interface component 30*b* of an inserted functional module 14, 16, in order to identify the inserted functional module 14, 16 and to connect it to a control unit through a corresponding data line (dashed lines).

Furthermore, each module receptacle 283 has a device-side thermal interface component 32*a*, which is in thermal contact with a corresponding, module-side thermal interface component 32b of an inserted functional module 14, 16. The device-side thermal interface components 32b are thermally connected (dotted lines) to one another and to a cooling apparatus (not shown).

Although additional interfaces, such as, for example, electrical and data interfaces, for controlling the functional modules 14, 16 are preferably provided, they are not shown in the figures for the sake of clarity.

A special feature of the module-side thermal interface components 32b of the illustrated embodiment lies in the fact that in comparison to the device-side thermal interface components 32a, they have contact area sizes that are different from one another. All of the module-side thermal interface components 32b are smaller than or at most just as large as the device-side thermal interface components 32a that are identical to one another with respect to size. The specific size of the module-side contact areas depends on the heat output of the respective functional modules 14, 16. In particular, there may be a proportionality between the heat output and the size of the thermal contact area of the modules.

Figure 4:
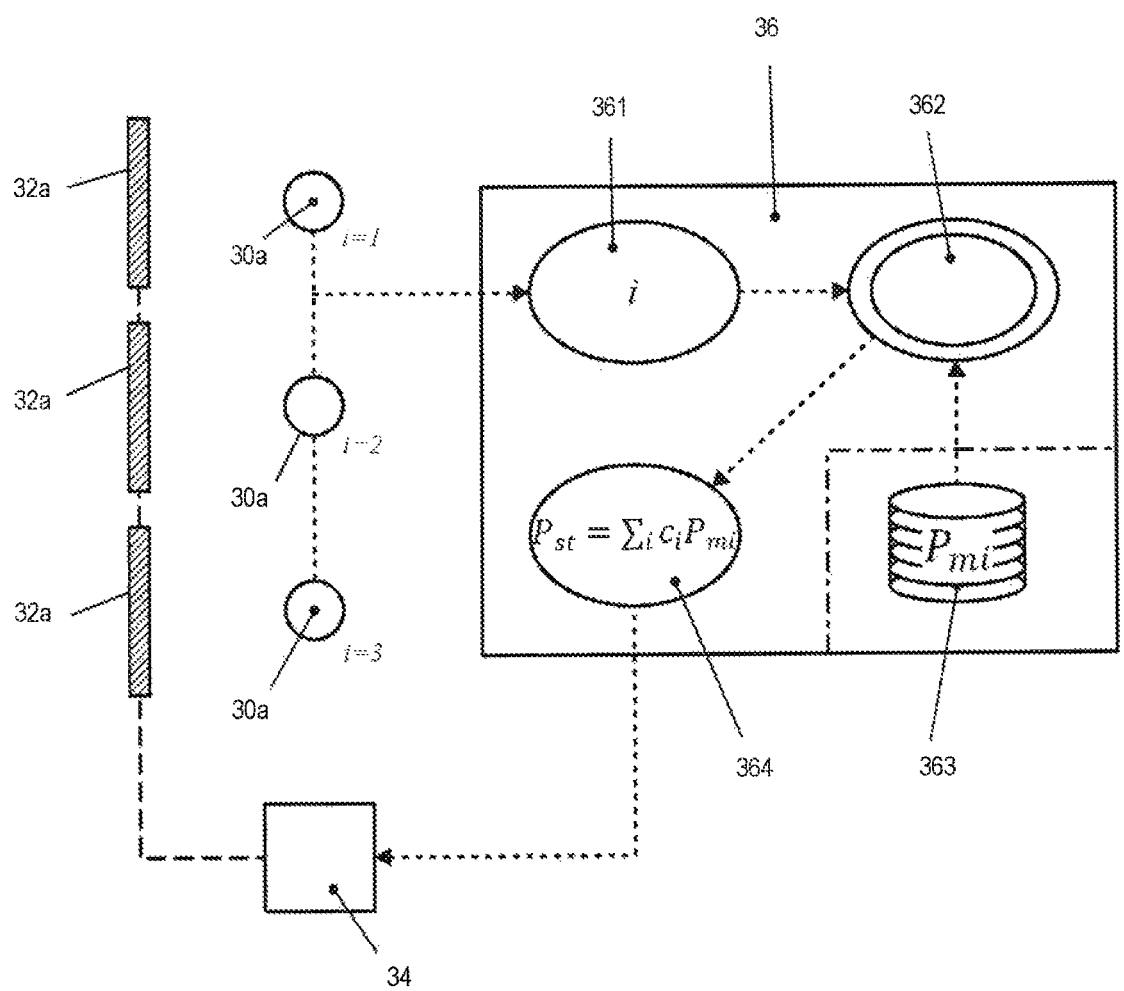

FIG. 4 shows a preferred embodiment of a control of the balance 12. Shown are the device-side thermal interface components 32a, which are thermally connected to one another and to a cooling apparatus 34, and the device-side identification interface components 30a, which are identified here in each case with the index i. The identification data, obtained by interaction between the device-side and module-side identification interface components 30a, b, are transmitted to a control apparatus 36, there, in particular, to the identification unit 361. In the embodiment shown in FIGS. 1 and 3, the identification interface i=1 would provide the information about the inserted lighting module 16. The identification interface i=2 would provide the information about the absence of an inserted functional module; and the identification interface i=3 would provide the information about the inserted laser scanner module 14. The identification can be carried out in a manner specific to the type of module or even in a manner specific to the individual module. The identification data are sent from the identification unit 361 to a central unit 362. The latter receives information about the specific heat outputs of the identified functional modules 14, 16 from a memory unit 363. As indicated by the dotted and dashed line, the memory unit 363 can be integrated in the control apparatus 36 or removed from it, for example, can be kept in a server, connected through the internet. However, this information can also be stored in a memory unit of the functional module itself In particular, it can be provided that after the functional module has been produced, said functional module is run through an individual measurement of its heat output at the factory in the context of the quality control, the result of which measurement is then stored in the memory unit. A type-specific storage without individual measurement is possible. In any case the storage of the information in the module itself combines the advantages of reducing the load on the balance control unit, the independence of external data sources and the possibility of customization.

From the identification data, on the one hand, and the heat output data, on the other hand, the central unit 362 calculates the default values for controlling the cooling apparatus 34; and then said default values are passed on to a cooling control unit 364, connected to the cooling apparatus. In the illustrated embodiment the predetermined cooling capacity $P_{st}$ corresponds to a static cooling capacity, which is derived from the sum of the individual heat outputs $P_{mi}$ of the identified functional modules 14, 16, in each case multiplied by a weighting factor $c_i$, combined: $P_{st}=\Sigma_i c_i P_{mi}$. In this case, the total cooling capacity P is obtained as a sum of a module-independent basic cooling capacity $P_0$ (not mentioned in FIG. 4) and the module-dependent static cooling capacity $P_{st}$: $P=P_0+P_{st}+P_v$.

The weighting factor $c_i$ can be used, for example, to take into account the specific position, i.e., the specific module receptacle, in which a functional module 14, 16 is inserted. Of course, such a weighting can also be dispensed with; in other words, the weighting factor corresponds then to 1 or is identical in all summands.

This static cooling capacity $P_{st}$ is uniformly distributed from the cooling apparatus 34 to all of the device-side thermal interface components 32a. The respective, requirement-specific distribution to the functional modules 14, 16 takes place in response to the different sizes of the module-side thermal interface components 32b.

In a further development of this cooling control, the static cooling capacity $P_{st}$ forms only one of a plurality of terms of the total cooling capacity P: $P=P_0+P_{st}+P_v$, where $P_v=P_v(T)$. In this embodiment, in addition to the static cooling capacity $P_{st}$, there is also provided a small, regulated cooling capacity contribution, the cooling capacity correction $P_v$, with which it is possible to compensate for small fluctuations of the temperature T in the weighing chamber 22.

The embodiments, discussed in the specific description and shown in the figures, represent only illustrative exemplary embodiments of the present invention. In light of the disclosure herein, the person skilled in the art is given a broad spectrum of possible variations. In particular, it is possible, as an alternative or in addition to the weighing chamber rear wall 28, to design one or more of the remaining walls of the weighing chamber wall in the manner described as a post/strut structure with recesses designed as module receptacles. In such cases, in which the module receptacles do not adjoin a chamber to be sealed, in particular, for reasons of calibration, a special sealing wall, as in the embodiment shown here, is not required.

LIST OF REFERENCE NUMERALS AND SYMBOLS 10 gravimetric measurement system
12 balance
14 functional module
15 diaphragm
16 functional module
18 weighing system chamber
181 weighing system
20 sample carrier
22 weighing chamber
23 weighing chamber cover
24 weighing chamber base
26 weighing chamber side wall
28 weighing chamber rear wall
281 post
282 strut
283 recess/module receptacle
284 end wall
30a/b device-side/module-side identification interface component
32a/b device-side/module-side thermal interface component
34 cooling apparatus
36 control apparatus
361 identification unit
362 central unit 363 memory unit
364 cooling control unit
P total cooling capacity
$P_0$ basic cooling capacity
$P_{st}$ static cooling capacity
$P_v$ cooling capacity correction
$c_i$ weighting factor
$P_{mi}$ module-specific heat output
T temperature (in the weighing chamber)

What is claimed is:

1. A gravimetric measuring system, comprising:
a balance with a weighing chamber surrounded by a plurality of weighing chamber walls;
an electromechanical weighing system; and
an electronic control apparatus for controlling the system operation according to routines stored in a memory of the electronic control apparatus;
wherein one of the weighing chamber walls is a rear wall comprising a ribbed or lattice structure configured as a carrier structure having a wall surface defining recesses constituting clearances which are open towards the weighing chamber and configured as module receptacles;
a plurality of functional modules configured respectively for insertion into the module receptacles; and
a plurality of diaphragms, which have no weighing function, and which are spatially adapted to the recesses;
wherein the recesses are configured to be closed by the diaphragms or the functional modules;
wherein the recesses occupy a majority portion of the wall surface of the one weighing chamber wall; and
wherein the carrier structure has in a region of one of the recesses, a device-side identification interface component, which is contacted in an identification data-transmitting manner by a corresponding module-side identification interface component, when a respective one of the functional modules is inserted into the one recess.

2. The gravimetric measuring system as claimed in claim 1, wherein:
the device-side identification interface component is designed as an optical, magnetic tactile, radio or electronic receiving unit; and
the module-side identification interface component is designed as a corresponding optical, magnetic, tactile, radio or electronic transmitting unit.

3. The gravimetric measuring system as claimed in claim 1,
wherein the carrier structure has, in a region of one of the recesses, a device-side thermal interface component, which is thermally connected to a central cooling apparatus and which is thermally contacted by a corresponding module-side thermal interface component, when the respective functional module is inserted.

4. The gravimetric measuring system as claimed in claim 1, wherein:
the weighing chamber rear wall is positioned as a separating element between the weighing chamber and a weighing system chamber, which encloses a weighing system that bears a sample carrier arranged in the weighing chamber, and
the recesses of the carrier structure are closed on the weighing system chamber side by a fixedly installed end wall.

5. The gravimetric measuring system as claimed in claim 4, wherein the fixedly installed end wall seals the weighing system chamber and precludes accessibility of the weighting system chamber to a user of the balance.

* * * * *